(12) United States Patent
Terasaki et al.

(10) Patent No.: US 8,138,088 B2
(45) Date of Patent: Mar. 20, 2012

(54) MANUFACTURING METHOD OF STRUCTURE BY IMPRINT

(75) Inventors: Atsunori Terasaki, Kawasaki (JP); Shingo Okushima, Tokyo (JP); Junichi Seki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 516 days.

(21) Appl. No.: 12/361,870

(22) Filed: Jan. 29, 2009

(65) Prior Publication Data
US 2009/0189306 A1 Jul. 30, 2009

(30) Foreign Application Priority Data

Jan. 30, 2008 (JP) ................................. 2008-018635

(51) Int. Cl.
*H01L 21/027* (2006.01)
(52) U.S. Cl. ................ 438/689; 216/41; 216/11; 216/2; 216/49; 216/52; 264/40.1; 264/496; 264/238; 438/401; 438/589; 438/694; 438/700; 438/758
(58) Field of Classification Search ................ 101/483; 264/331.19, 238, 496; 360/31; 313/581; 430/1, 30, 296, 271.1, 320; 438/199, 401, 438/589, 700, 689; 257/616
See application file for complete search history.

(56) References Cited

U.S. PATENT DOCUMENTS

| 7,077,992 B2 | 7/2006 | Sreenivasan et al. |
| 2005/0079448 A1* | 4/2005 | Nakada et al. ................ 430/296 |
| 2005/0270312 A1 | 12/2005 | Lad et al. |
| 2006/0141385 A1* | 6/2006 | Kaule ........................ 430/270.1 |
| 2008/0214010 A1 | 9/2008 | Yoneda et al. |

FOREIGN PATENT DOCUMENTS

WO 2009/020193 A2 2/2009

OTHER PUBLICATIONS

Stephen Y. Chou et. al., "Imprint of Sub-25 nm Vias and Trenches in Polymers," 67(21) Appl. Phys. Lett. 3114-16 (1995).

* cited by examiner

*Primary Examiner* — Duy Deo
*Assistant Examiner* — Erin Flanagan
(74) *Attorney, Agent, or Firm* — Fitzpatrick, Cella, Harper & Scinto (57) ABSTRACT

A manufacturing method of a structure by an imprint process includes a first imprint step of forming a first resin material layer by applying a first resin material onto a substrate and then transferring an imprint pattern of a mold onto the first resin material layer, a second imprint step of forming a second resin material layer by applying a second resin material onto the first resin material layer formed in the first imprint step and onto an area of the substrate adjacent to the first resin material layer and then transferring the imprint pattern of the mold onto the second resin material layer, and a step of forming a pattern by etching the first and second resin material layers.

20 Claims, 9 Drawing Sheets

MANUFACTURING METHOD OF STRUCTURE BY IMPRINT

FIELD OF THE INVENTION AND RELATED ART

The present invention relates to a method of manufacturing a structure by using an imprint method of transferring a pattern of a mold onto a resin material layer.

In recent years, fine processing technology for transferring a fine structure on a mold onto a member to be processed, such as a resin material, a metal material, or the like, has been developed and has received attention (Stephan Y. Chou et al., Appl. Phys. Lett., Vol., 67, Issue 21, pp. 3114-3116 (1995)). This technology is called nanoimprint or nanoembossing and provides a resolution on the order of several nanometers. For this reason, the technology has been increasingly expected to be applied to next-generation semiconductor manufacturing technologies in place of light exposure devices, such as a stepper, a scanner, and the like. Further, the technology is capable of collectively processing a three-dimensional structure at a wafer level, so that the technology has been expected to be applied to a wide variety of fields, such as manufacturing technologies for optical devices, such as photonic crystal and biochips, such as μ-TAS (Micro Total Analysis System).

In the case where such processing technology is applied to semiconductor manufacturing, the processing is performed in the following manner.

A work (workpiece) including a substrate (e.g., a semiconductor wafer) and a photocurable resin material layer disposed on the substrate and a mold on which a desired imprint (projection/recess) pattern is formed are disposed opposite each other and the resin material is filled between the work and the mold, followed by irradiation of ultraviolet (UV) light to cure the resin material.

As a result, the above pattern is transferred onto the resin material layer and then etching or the like is effected by using the resin material layer as a mask, so that pattern formation on the substrate is performed.

In such imprint, as a method suitable for the semiconductor manufacturing, a step-and-repeat method in which a transfer onto a substrate is successively performed by using a mold smaller in size than the substrate has been known (U.S. Pat. No. 7,077,992).

According to this method, the mold size is made smaller than the substrate size, so that it is possible to decrease an integrated error due to the increase in size during the mold pattern transfer (formation). Further, the cost of mask preparation can be reduced.

As a method suitable for resin material layer formation in the step-and-repeat method, a drop-on-demand method in which a resin material is applied with every shot has been known (U.S. Patent Application Publication No. US2005/0270312).

According to this method, by locally adjusting an amount of the resin material depending on a pattern density or shape of a mold, a thickness of the resin material layer during imprinting can be made uniform, thus improving transfer accuracy.

In the case where the imprint is performed by the above-described step-and-repeat method, a gap between adjacent shot areas is desirably as small as possible and the adjacent shot areas are ideally completely connected to each other. This is because the excessive area is reduced as much as possible, so that the number of chips obtained from one substrate can be increased, and, accordingly, the cost per one ship can be reduced.

Further, in the case of periodically forming a similar pattern, repetitive imprinting using a mold having a part of the pattern can be advantageous in terms of the total cost including preparation of the mold. Particularly, when a large-sized device is prepared, the integrated error during the pattern formation can be alleviated, so that it is possible to improve the accuracy of a dimension or a position. However, in the case where the imprint process is performed by a step-and-repeat method in which the drop-on-demand method is applied to form a resin material layer, when adjacent shot areas are intended to be brought as close to each other as possible, a problem of adjacent resin material layers interfering with each other occurs.

Figure 8:
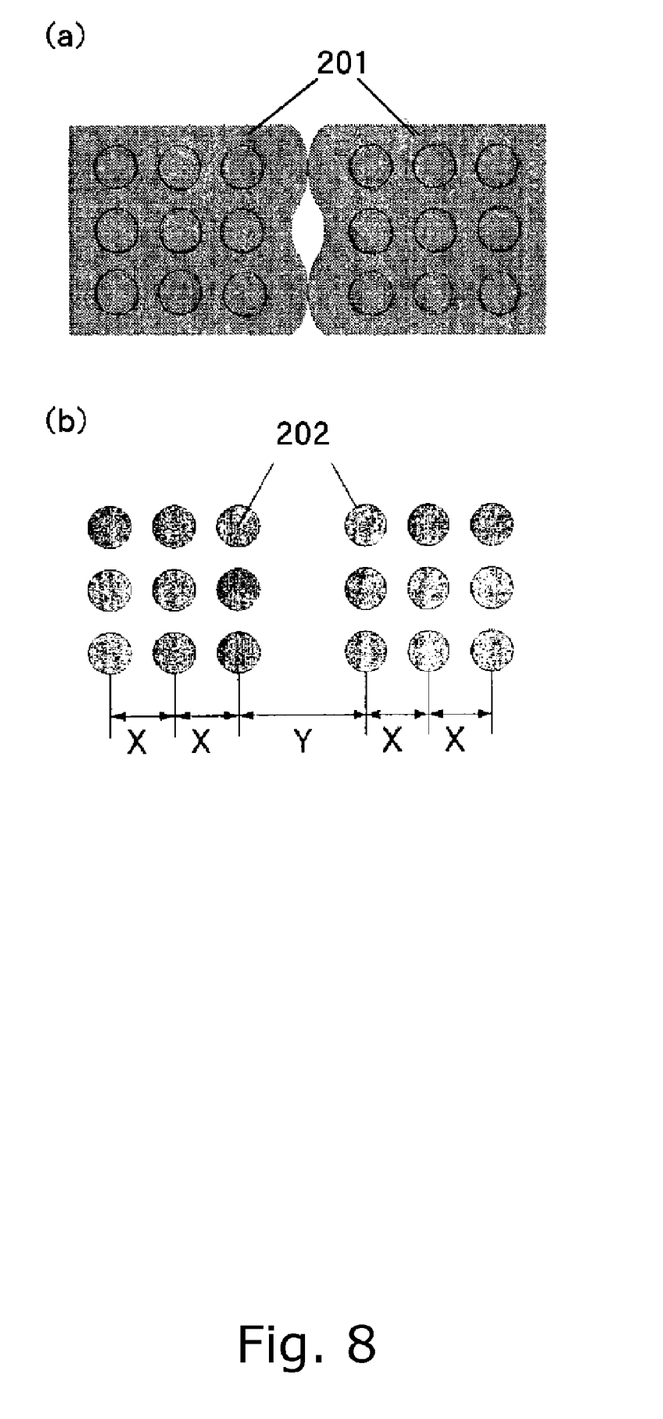
FIGS. 8(a) and 8(b) are top plan views for illustrating a conventional manufacturing method of a structure.

To describe the problem, e.g., an embodiment in which a periodical dot pattern is imprinted is shown in FIG. 8(a). Referring to FIG. 8(a), each of resin material layers 201 is formed by each imprint shot.

FIG. 8(b) shows a dot pattern 202 processed on a substrate by the imprint pattern. In FIG. 8(b), X represents a periodical width of the dot pattern and Y represents a width or distance (gap) between adjacent shot areas (adjacent transferable range by mold).

Generally, during the preparation of the mold, it is difficult to form a pattern to an end portion of the mold.

Further, even when the pattern can be formed to the mold end portion, it is difficult to ideally control the resin material layer at an end of the mold, so that the resin material layer 201 can be formed outside the mold surface.

For example, as shown in FIG. 8(a), adjacent end portions of the resin material layers 201 cause excessive areas due to waving thereof or the like, with a width larger than the periodical width of the pattern, so that it is difficult to bring the adjacent end portions close to each other by an interference between the excessive areas in some cases. That is, the distance Y between the adjacent shot areas is larger than the periodical width X of the dot pattern, thus failing to provide an ideal periodical structure in some cases.

Such a problem is not limited to the case of the dot pattern, but is also true for other periodical patterns, a continuous pattern, such as a line-and-space pattern, and a free pattern.

For this reason, when a larger device is manufactured by connecting patterns of adjacent shot areas to each other by using the step-and-repeat method, it is desired that the above-described problem be solved.

SUMMARY OF THE INVENTION

In view of the above-described problem, a principal object of the present invention is to provide a manufacturing method of a structure by an imprint process capable of connecting patterns of adjacent shot areas to each other with a high level of accuracy.

According to an aspect of the present invention, there is provided a manufacturing method of a structure by imprint, comprising:

a first imprint step of forming a first resin material layer by applying a first resin material onto a substrate and then transferring an imprint pattern of a mold onto the first resin material layer;

a second imprint step of forming a second resin material layer by applying a second resin material onto the first resin material layer formed in the first imprint step and onto an area of the substrate adjacent to the first resin material layer and then transferring the imprint pattern of the mold onto the second resin material layer; and a step of forming a pattern by etching the first and second resin material layers.

The manufacturing method may further comprise a step of etching the substrate through the pattern formed by etching the first and second resin material layers as a mask.

The manufacturing method may further comprise a first etching step of etching the second resin material, different from the first resin material, under a condition that the first and second resin materials provide a selection ratio when the pattern is formed by etching the first and second resin material layers. The manufacturing method may further comprise a second etching step of etching the first and second resin materials under a condition that a selection ratio is lower than the selection ratio in the first etching step when the pattern is formed by etching the first and second resin material layers. In the first etching step, the second etching step may be performed after the second resin material layer is etched to a predetermined thickness. In the second etching step, the first etching step may be performed after the first resin material layer is etched to a predetermined thickness.

In the first etching step, the first and second resin material layers may be etched until a recess of the pattern formed on the first resin material layer and a recess of the pattern formed on the second resin material layer have the same height.

The first resin material may be a silicon-containing resin material or a silicon oxide compound and the second resin material may be a non-silicon-based material.

In the manufacturing method of the present invention, the selection ratio in the first etching step may be 5 or more.

The manufacturing method may further comprise:

a step of forming a third material layer as an upper layer and a fourth material layer as a lower layer between a surface of the substrate and a surface at which the first resin material layer is to be formed;

a step of forming a first pattern by etching the third material layer through, as a mask, the pattern formed by etching the first and second resin material layers; and a step of forming a second pattern by etching the fourth material layer through the first pattern as a mask. The manufacturing method may further comprise a step of processing the substrate by etching through the second pattern as a mask.

The manufacturing method of the present invention may further comprise:

a step of forming a first reverse layer on the first resin material layer, onto which the pattern of the mold is transferred, in the first imprint step; and a step of forming a second reverse layer on the second resin material layer, onto which the pattern of the mold is transferred, in the second imprint step manufacturing method may further comprise:

a step of removing the second reverse layer until a projection of the second resin material layer is exposed;

a step of forming a first reverse pattern by etching the second resin material layer through the second reverse layer as a mask;

a step of forming a second reverse pattern by etching the first reverse layer through the first reverse pattern as a mask;

a step of forming a third reverse pattern by etching the first resin material layer through the second reverse pattern as a mask; and a step of processing the substrate by etching through the third reverse pattern as a mask. The step of forming the third reverse pattern may include a step of removing the second reverse layer and the first reverse layer until a projection of the first resin material layer is exposed.

In the step of forming the first reverse pattern and the step of forming the third reverse pattern, the second resin material layer and the second reverse layer or the first resin material layer and the first reverse layer may provide a selection ratio of 5 or more. The manufacturing method may further comprise:

a step of forming a fourth material layer between a surface of the substrate and a surface at which the first resin material layer is to be formed;

a step of forming a fourth reverse pattern by etching the fourth material layer through the third reverse pattern as a mask; and a step of processing the substrate by etching through the fourth reverse pattern as a mask. The manufacturing method may further comprise:

a step of forming a third material layer as an upper layer and a fourth material layer as a lower layer between a surface of the substrate and a surface at which the first resin material layer is to be formed;

a step of forming a fifth reverse pattern by etching the third material layer through the third reverse pattern as a mask;

a step of forming a sixth reverse pattern by etching the fourth material layer through the fifth reverse pattern as a mask; and a step of processing the substrate by etching through the sixth reverse pattern as a mask.

In the manufacturing method of the present invention, the third material layer may be formed of a material selected from the group consisting of silicon dioxide, silicon nitride, a silicon-containing resin material, a silicon oxide compound, and a metal material. The fourth material layer may be formed of a hydrocarbon compound or a carbon compound.

The first reverse layer and the second reverse layer may be formed of a material selected from the group consisting of silicon dioxide, silicon nitride, a silicon-containing resin material, a silicon oxide compound, and a metal material.

According to the present invention, the patterns of the adjacent shot areas can be connected to each other with a high level of accuracy.

These and other objects, features, and advantages of the present invention will become more apparent upon a consideration of the following description of the preferred embodiments of the present invention taken in conjunction with the accompanying drawings.

BRIEF DESCRIPTION OF THE DRAWINGS

FIGS. 1(a) to 1(f) are cross-sectional views for illustrating the manufacturing method of a structure according to the present invention.

FIGS. 2(a) to 2(e) and FIGS. 3(a) to 3(c), are top plan views for illustrating the manufacturing method of a structure according to the present invention.

FIGS. 4(a) to 4(i), FIGS. 5(a) to 5(i), FIGS. 6(a) to 6(k), and FIGS. 7(a) to 7(l) are cross-sectional views for illustrating the manufacturing method of a structure according to the present invention.

DESCRIPTION OF THE PREFERRED EMBODIMENTS

Embodiments of the present invention will be described in detail with reference to the drawings.

In one embodiment, a substrate is processed in the following manner by using an imprint method for transferring a pattern of a mold onto a resin material in accordance with the manufacturing method of a structure of the present invention.

In the manufacturing method of the structure by imprint in which the mold pattern is transferred onto the resin material, an imprint step is divided into a first imprint step for a first imprint and a second imprint step for a second imprint. The second imprint is performed, on a substrate surface, in an area different from an area where the first imprint is performed.

In this case, on a first resin material layer formed by the first imprint, a second resin material layer is formed by the second imprint so that a part of the second resin material layer overlaps with a part of the first resin material layer. Then, etching is effected in a single step by using imprint patterns formed by the first imprint and the second imprint.

That is, by disposing a part of an imprint area for the first imprint and a part of an imprint area for the second imprint so as to overlap with each other when these areas are observed from above, it is possible to connect patterns of adjacent shot areas (adjacent imprint areas) to each other.

Herein, the substrate means a member to be processed including not only a single material substrate, such as a silicon wafer, but also a multi-layer substrate on which multiple films are formed.

Hereinbelow, preferred embodiments of the present invention will be described with reference to the drawings. In the respective figures, identical or corresponding portions are represented by identical reference numerals or symbols.

Embodiment 1

In Embodiment 1, a manufacturing method of a structure according to the present invention will be described.

FIGS. 1(a) to 1(f) are cross-sectional views for illustrating the second manufacturing method using an imprint method in this embodiment.

Figure 1:
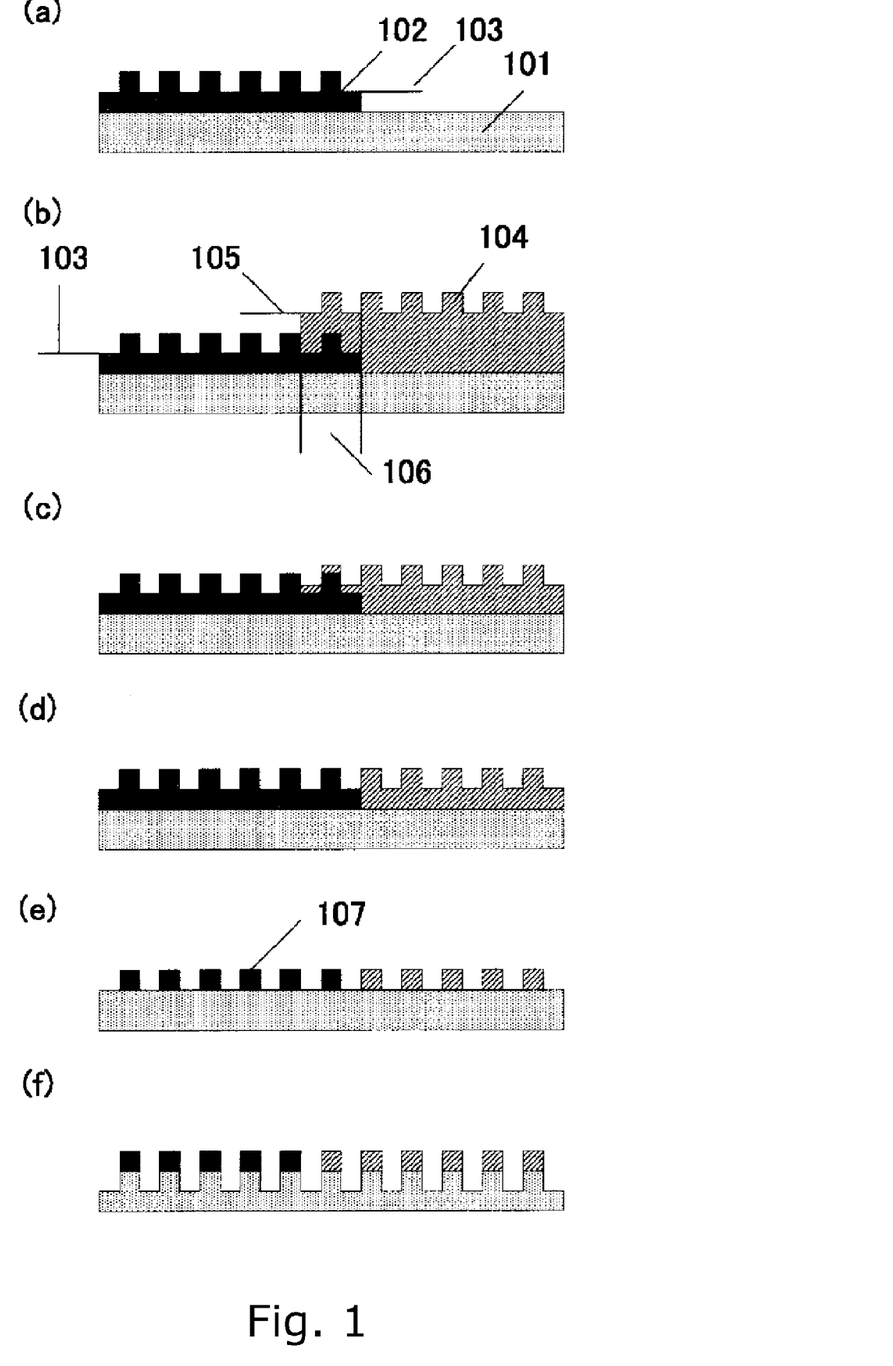

(1) In a first imprint step, a first resin material is applied onto a substrate 101 to form a first resin material layer 102, and then an imprint (projection/recess) pattern of a mold is formed on the first resin material layer 102 (FIG. 1(a)). In the imprint, it is difficult to completely eliminate a film thickness of the resin material layer between a substrate surface and a recess of the pattern formed on the resin material layer. For that reason, as shown in FIG. 1(a), a residual film 103 is generated between the substrate surface and the recess of the pattern formed on the resin material layer 102 of the first resin material.

(2) In a second imprint step, a second resin material is applied onto the substrate 101 to form a second resin material layer 104, and then an imprint pattern of the mold is formed on the second resin material layer 104 (FIG. 1(b)). In this step, the term "onto the substrate 101" means that the second resin material is applied onto both the first resin material layer 102 formed in the first imprint step and an area, on the substrate 101, adjacent to the first resin material layer 102. Also, in this step, as shown in FIG. 1(b), a residual film 105 is generated.

In this embodiment, the residual film 103 has a height (from the substrate surface to the recess of the first reverse layer of the first resin material) different from a height of the residual film 105 (a height from the substrate surface to a recess of the second resin material layer of the second resin material).

Further, the first resin material layer 102 and the second resin material layer 104 are formed in an area 106 so as to overlap with each other as seen in a direction of a normal to the substrate surface.

(3) In a first etching step, under a condition that the resin material layer 104 can be selectively removed compared with the resin material layer 102, the resin material layer 104 is subjected to etching uniformly at the entire surface thereof with respect to a direction perpendicular to the substrate surface (FIG. 1(c)). Hereinafter, this operation is referred to as an "etch back".

The etching is continued until the resin material layer 102 and the resin material layer 104 have substantially the same height from the substrate surface (FIG. 1(d)).

(4) In a second etching step, after the respective resin material layers are etched to have a predetermined height from the substrate surface, the resin material layer 102 and the resin material layer 104 are subjected to the etch back at the entire surfaces thereof such that the resin material layer 102 and the resin material layer 104 can be etched at the substantially same etching rate until the substrate surface is exposed at recesses of the respective resin material patterns (FIG. 1(e)). That is, the resin material layer 102 and the resin material layer 104 are subjected to etching under a condition that a selection ratio in this step is lower than a selection ratio for an etching condition in the first etching step. As a result, a pattern 107 is formed on the substrate 101.

(5) By using the pattern 107 as a mask, the substrate 101 is etched (FIG. 1(f)). Through the above-described steps, it is possible to process the substrate in a single etching step by using a mask pattern, which is formed in the two imprint steps so that parts of the respective resin material layers overlap with each other. Incidentally, the single etching step referred to herein means an etching process carried out by a single introduction of the substrate into a vacuum chamber. In other words, it is not necessary to carry out etching after each of the two (first and second) imprint steps. This means a considerable reduction in the number of steps, which is advantageous in terms of cost.

The process in this embodiment is realized by providing a difference in height between the residual film 103 and the residual film 105, but the difference can be adjusted by, e.g., a difference in the amount of application (coating) of the resin material.

Further, in this embodiment, in order to realize selective etching as shown in FIG. 1(c), the resin material layer 102 and the resin material layer 104 are required to be formed of different resin materials.

For example, the selection etching can be realized by using a silicon oxide, such as a silicon (Si) containing resin material or HSQ (hydrogen silsesquioxane), for the resin material layer 102 and using a non-silicon resin material or the like containing no Si-containing material for the resin material layer 104. As the non-silicon resin material, it is possible to use general-purpose photocurable resin materials of acrylic type, epoxy type, and vinyl ether type. The silicon-containing resin material comprises the non-silicon resin material and a resin material having silicon added into the non-silicon resin material. As an additive material, it is possible to use, e.g., (3-acryloxypropyl)tris(trimethylsiloxy)silane ("SIA0210.0", mfd. by Gelest, Inc.).

The whole (entire surface) etching of the resin material layer 104 and the resin material layer 102 is a process for removing the residual film 105 and the residual film 103 to finally expose the substrate surface at the recesses of the respective resin material patterns.

As an etching condition, e.g., in the step of selectively etching the resin material layer 104, it is possible to utilize a gas system, such as an $O_2$-based gas including $O_2$, $O_2/Ar$, $O_2/N_2$, and the like, or a three-gas mixture-based gas including a mixture of three gases: $N_2$, $H_2$, and $NH_3$.

In order to keep a thickness and a shape of the pattern of the resin material layer 102 during the etching of the resin material layer 104, an etching selection ratio may desirably be 5 or more.

In the step of etching the resin material layer 102 and the resin material layer 104 at substantially the same etching rate, as the gas system, e.g., it is possible to use fluorocarbon-based gas, such as $CF_4$, $CHF_3$, $C_2F_6$, $C_3F_8$, $C_4F_8$, $C_5F_8$, or $C_4F_6$.

Figure 2:
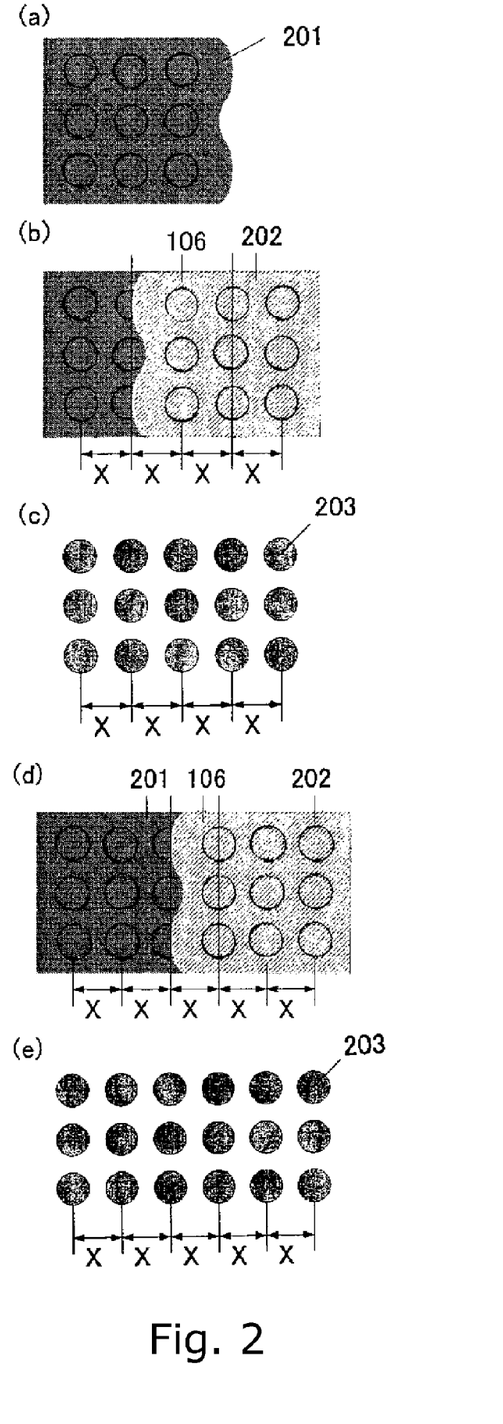

As a form of the area 106 in which the resin material layer 102 and the resin material layer 104 overlap with each other, there is also the case where a part of a necessary pattern and a part of another necessary pattern overlap with each other as shown in FIGS. 2(a) to 2(c). Further, there is the case where adjacent excessive areas of end portions of two patterns overlap with each other as shown in FIGS. 2(d) and 2(e). These forms can be appropriately used.

In FIGS. 2(a) to 2(e), reference numeral 201 represents a first resin material layer of a first resin material, reference numeral 202 represents a second resin material layer of a second resin material, and reference numeral 203 represents a pattern.

Figure 3:
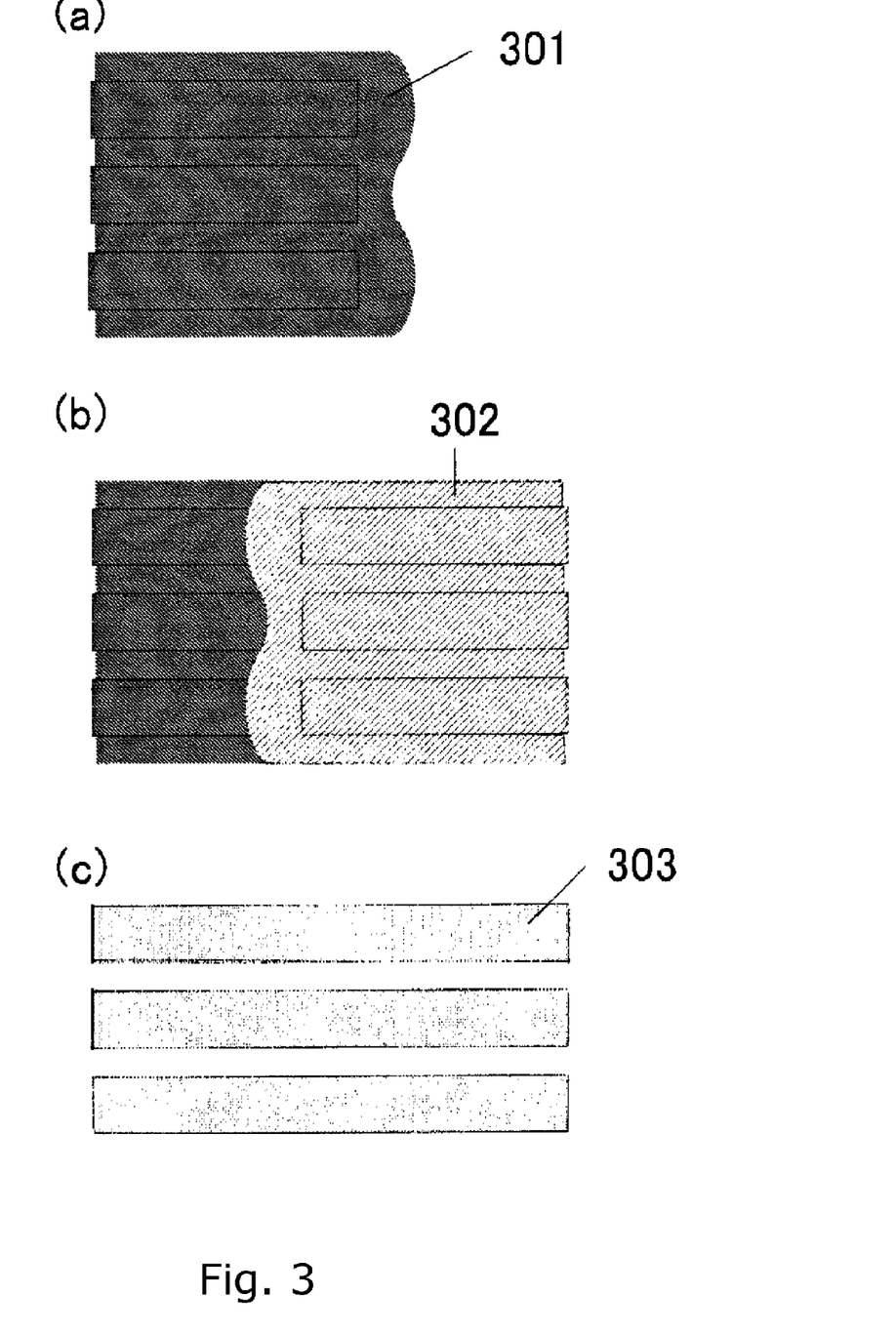

In addition to a dot pattern as shown in FIGS. 2(a) to 2(e), similar forms may also be employed with respect to the connection of a line pattern as shown in FIGS. 3(a) to 3(c). In FIGS. 3(a) to 3(c), reference numeral 301 represents a first resin material layer of a first resin material, reference numeral 302 represents a second resin material layer of a second resin material, and reference numeral 303 represents a pattern. Also, with respect to the connection of free patterns other than the above-described patterns, similar forms can be employed.

Figure 9:
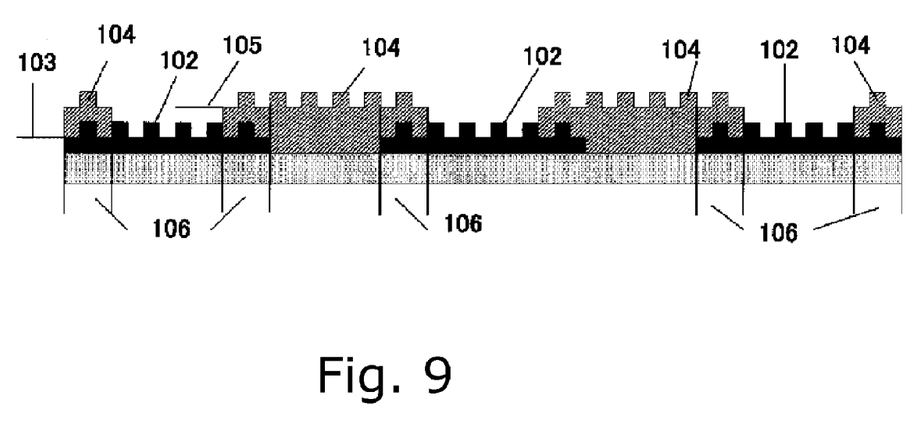
FIG. 9 is a cross-sectional view for illustrating the manufacturing method of a structure according to the present invention.

By effecting the imprint process in such a manner that a pattern of the resin material layer 102 and a pattern of the resin material layer 104 are alternately disposed as shown in FIG. 9, it is possible to prepare a large-sized pattern.

Incidentally, the etching conditions in the step (3) and the etching conditions in the step (4) can be reversed. That is, the step of etching the resin material layer 102 and the resin material layer 104 at the substantially same etching rate is performed and then the step of selectively etching the resin material layer 104 is performed, so that it is also possible to obtain the same structure. Further, it is also possible to use, as the structure, the resin material layer in a state in the step (4) as it is without performing the substrate processing step (5). As such a form, e.g., it is possible to use a wiring groove or the like for embedding in order to form wiring for photonic crystal or an electronic device. Further, these resin material layers can also be used as a sacrifice layer or used for a lift-off process.

Embodiment 2

Embodiment 2 is a modified embodiment based on Embodiment 1.

In Embodiment 1, the mask material used for etching the substrate is different between the resin material layer 102 and the resin material layer 104. As a result, in some cases, etching characteristics vary between these two resin material layers and selection latitude of the etching process is substantially reduced.

In this embodiment, in order to solve these problems, e.g., a fourth material layer is configured to be disposed under the imprint resin material layer, so that in-plane uniformity of a final mask material is realized.

FIGS. 4(a) to 4(i) are cross-sectional views for illustrating a manufacturing method of a structure by using an imprint method in this embodiment.

Figure 4:
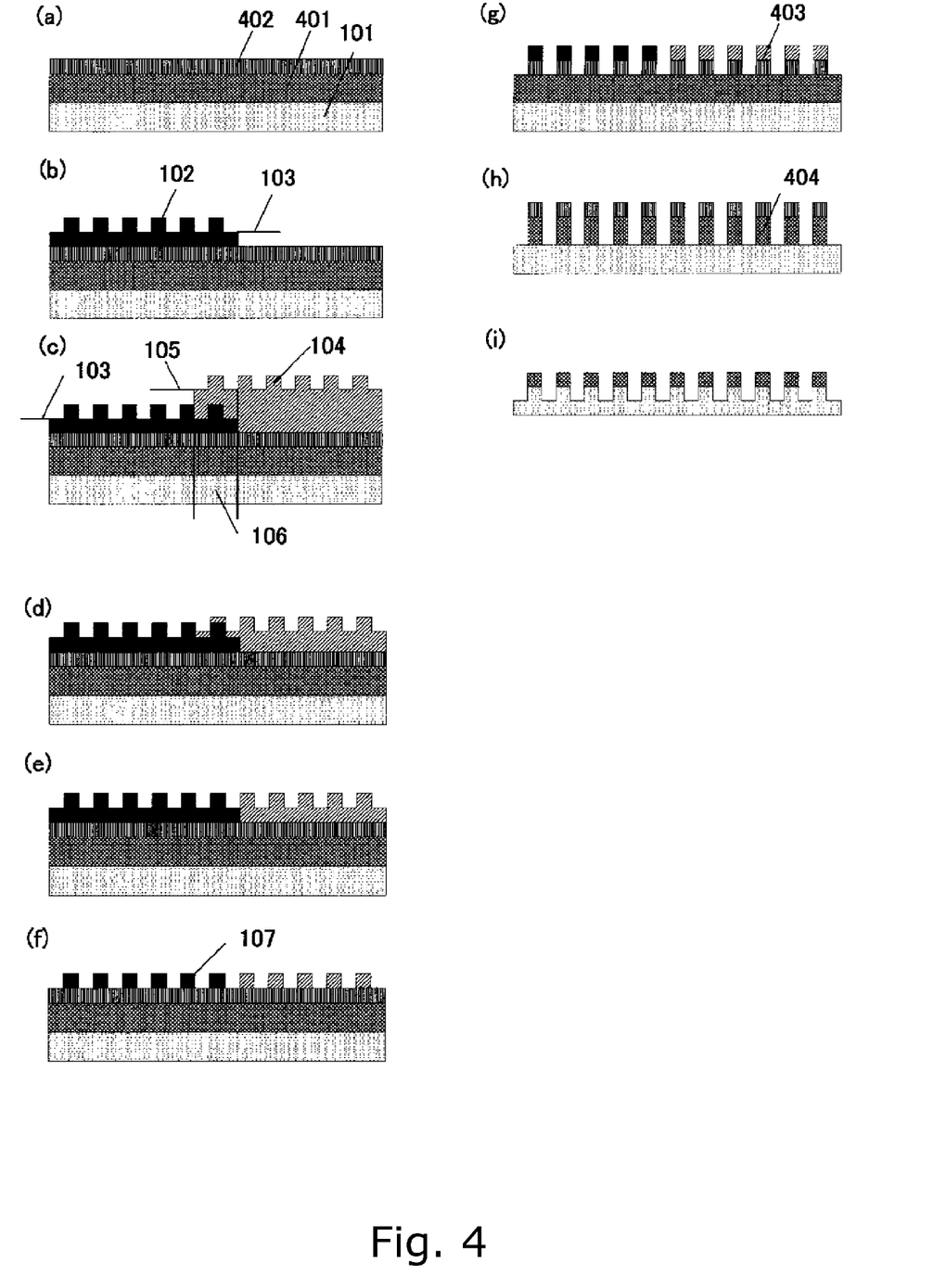

(1) A fourth material layer 401 is formed on a substrate 101 and thereon a third material layer 402 is formed (FIG. 4(a)).

(2) A first resin material is applied onto the third material layer 402 to form a first resin material layer 102, and then an imprint (projection/recess) pattern of a mold is formed on the first resin material layer 102 (FIG. 4(b)). At that time, a residual film 103 is generated.

(3) A second resin material is applied onto the third material layer 402 to form a second resin material layer 104, and then an imprint pattern of the mold is formed on the second resin material layer 104 (FIG. 4(c)). At that time, a residual film 105 is generated.

The residual film 103 has a height (from the substrate surface to the recess of the first reverse layer of the first resin material) different from a height of the residual film 105 (a height from the substrate surface to a recess of the second resin material layer of the second resin material).

Further, the first resin material layer 102 and the second resin material layer 104 are formed in an area 106 so as to overlap with each other as seen in a direction of a normal to the substrate surface.

(4) In a first etching step, under a condition that the resin material layer 104 can be selectively removed compared with the resin material layer 102, the resin material layer 104 is subjected to the etch back at the entire surface thereof.

The etching is continued until the resin material layer 102 and the resin material layer 104 have substantially the same height from the substrate surface (FIG. 4(e)).

(5) The resin material layer 102 and the resin material layer 104 are subjected to the etch back at the entire surfaces thereof, under a condition that the resin material layer 102 and the resin material layer 104 can be etched at substantially the same etching rate, until a surface of the third material layer 402 is exposed at recesses of the respective resin material layers (FIG. 4(f)). As a result, a pattern 107 is formed on the substrate 101.

(6) By using the pattern 107 as a mask, the third material layer 402 is etched (FIG. 4(g)). As a result, a pattern 403 as a first pattern is formed.

(7) By using the pattern 403 as a mask, the fourth material layer 401 is etched (FIG. 4(h)). As a result, a pattern 404 as a second pattern is formed.

(8) By using the pattern 404 as a mask, the substrate 101 is etched (FIG. 4(i)).

Through the above-described steps, it is possible to realize in-plane uniformization of the mask material used for etching the substrate by replacing the patterns of the resin material layers 102 and 104 different in material with the fourth and third material layers 401 and 402.

A material for the third material layer 402 can be selected from, e.g., the group consisting of silicon-based materials, such as silicon dioxide ($SiO_2$) and silicon nitride (SiN); a silicon-containing resin material; a silicon oxide compound; a metal material; and the like.

A material for the fourth material layer 401 can be selected from, e.g., the group consisting of a hydrocarbon compound, such as a general-purpose resist material or an organic reflection-preventing film (BARC (bottom anti-reflective coating)); and a carbon compound, such as SOC (spin on carbon) or a deposited carbon film.

In the etching step of the third material layer 402, as the gas system, e.g., in the case where $SiO_2$ is selected as the material for the third material layer 402, it is possible to use fluorocarbon-based gas, such as $CF_4$, $CHF_3$, $C_2F_6$, $C_3F_8$, $C_4F_8$, $C_5F_8$, or $C_4F_6$.

In the etching step of the fourth material layer 401, it is possible to utilize a gas system, such as an $O_2$-based gas including $O_2$, $O_2/Ar$, $O_2/N_2$, and the like, or a three-gas mixture-based gas including a mixture of three gases: $N_2$, $H_2$, and $NH_3$.

In this case, an etching selection ratio between the fourth material layer 401 and the third material layer 402 may desirably be, e.g., 5 or more.

Incidentally, the etching of the third material layer 402 is performed through the mask patterns of the resin material layers 102 and 104 different in material. However, the third material layer 402 is very thin, so that when compared with the etching of the substrate, it is possible to suppress an influence of a difference in etching characteristic when the different materials are used for the mask pattern.

Embodiment 3

Embodiment 3 is another embodiment of the manufacturing method of a structure according to the present invention.

In Embodiment 1 and Embodiment 2, the removal of the residual films is performed by the etch back in which the resin material layer is uniformly etched at the entire surface thereof with respect to the direction perpendicular to the substrate surface.

However, in the etch back, an edge of the mask is removed during the etching, so that dimensional accuracy and verticality of a shape in the substrate etching are deteriorated in some case.

A means for solving these problems is incorporated in the manufacture of a structure by the imprint method in this embodiment, as shown in FIGS. 5(a) to 5(i).

(1) A first resin material is applied onto a substrate 101 to form a first resin material layer 102, and then an imprint (projection/recess) pattern of a mold is formed on the first resin material layer 102 (FIG. 4(a)). At that time, a residual film 103 is generated.

Figure 5:
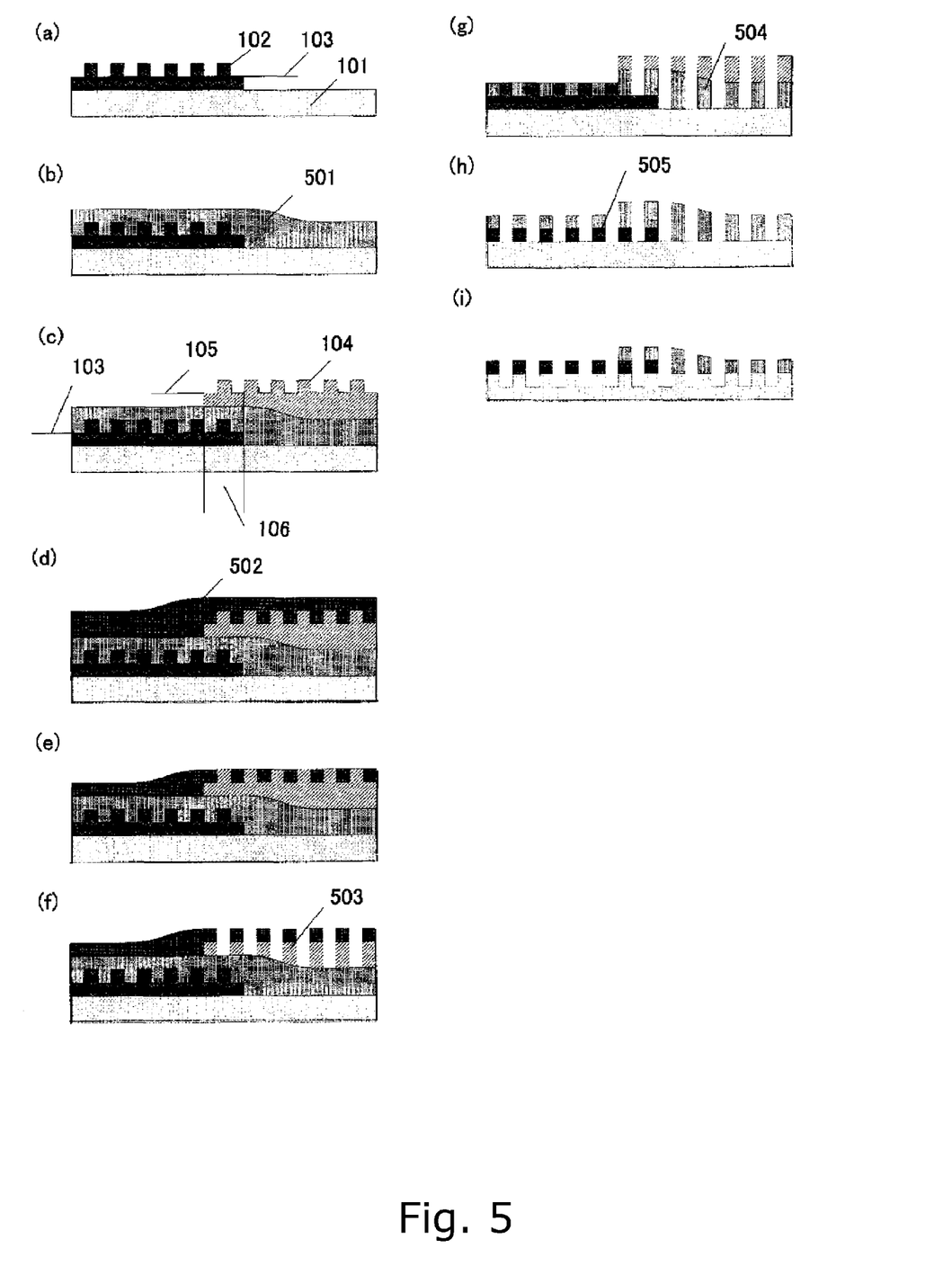

(2) A reverse layer 501 as a first reverse layer is formed on the resin material layer 102 and an exposed portion of the substrate 101 (FIG. 5(b)).

(3) A second resin material is applied onto the reverse layer 501 to form a second resin material layer 104, and then an imprint pattern of the mold is formed on the second resin material layer 104 (FIG. 5(c)). At that time, a residual film 105 is generated.

The residual film 103 has a height (from the substrate surface to the recess of the first reverse layer of the first resin material) different from a height of the residual film 105 (a height from the substrate surface to a recess of the second resin material layer of the second resin material).

Further, the first resin material layer 102 and the second resin material layer 104 are formed in an area 106 so as to overlap with each other as seen in a direction of a normal to the substrate surface.

(4) A reverse layer 502 as a second reverse layer is formed on the resin material layer 104 and an exposed portion of the reverse layer 501 (FIG. 5(d)).

(5) The reverse layer 502 is removed until a projection of the resin material layer 104 is exposed (FIG. 5(e)). This removal processing can be selected from the group consisting of etching, CMP (chemical mechanical polishing), a mechanical polishing, and the like.

(6) By using the reverse layer 502 as a mask, the resin material layer 104 is etched (FIG. 5(f)). As a result, a pattern 502 as a first reverse pattern is formed.

(7) The reverse layer 502 is removed, and thereafter, the reverse layer 501 is etched until a projection of the resin material layer 102 is exposed (FIG. 5(g)). At the same time, the reverse layer 501 under the resin material layer 104 is etched through the pattern 503 as a mask. As a result, a pattern 504 as a second reverse pattern is formed.

(8) The resin material layer 102 is etched through the reverse layer 501 as a mask (FIG. 5(h)). As a result, a pattern 505 as a third reverse pattern is formed.

(9) The substrate 101 is etched through the patterns 504 and 505 as a mask (FIG. 5(i)).

This process for reversing the resin material patterns by using the reverse layer can provide a vertical mask shape with less edge removal by appropriately selecting a combination of materials capable of providing an etching selection ratio between the reverse layer and the resin material layer.

A material for the reverse layers 501 and 502 can be selected from, e.g., the group consisting of silicon-based materials, such as $SiO_2$ and SiN; a silicon-containing resin material; a silicon oxide compound; a metal material; and the like.

The reverse layers 501 and 502 may also be formed of the same material. A reverse layer-forming method is selected from the group consisting of spin coating, vapor deposition, CVD (chemical vapor deposition), and the like.

The materials for the resin material layers 102 and 104 may also be identical to each other.

In the case where the removal processing of the reverse layers 501 and 502 is performed by etching, as the gas system, e.g., it is possible to use fluorocarbon-based gas, such as $CF_4$, $CHF_3$, $C_2F_6$, $C_3F_8$, $C_4F_8$, $C_5F_8$, or $C_4F_6$.

In the etching step of the resin material layers 102 and 104, it is possible to utilize a gas system, such as an $O_2$-based gas including $O_2$, $O_2/Ar$, $O_2/N_2$, and the like, or a three-gas mixture-based gas including a mixture of three gases: $N_2$, $H_2$, and $NH_3$.

In this case, an etching selection ratio between the resin material layers 102 and 104 and an etching selection ratio between the reverse layers 501 and 502 may desirably be, e.g., 5 or more.

Embodiment 4

Embodiment 4 is a modified embodiment based on Embodiment 3.

In Embodiment 3, similar to Embodiment 1, the mask material used for etching the substrate is different between the pattern 504 and the pattern 505.

In this embodiment, in order to solve the problems described in Embodiment 3, a fourth material layer is disposed under the imprint resin material layer, so that in-plane uniformity of a final mask material is realized.

FIGS. 6(a) to 6(k) are cross-sectional views for illustrating a manufacturing method of a structure by use of an imprint method in this embodiment.

(1) A fourth material layer 401 is formed on a substrate 101 (FIG. 6(a)).

(2) A first resin material is applied onto the fourth material layer 401 to form a resin material layer 102 and then an imprint (projection/recess) pattern of a mold is formed on the resin material layer 102 (FIG. 6(b)). At that time, a residual film 103 is generated.

(3) A reverse layer 501 is formed on the resin material layer 102 and an exposed portion of the fourth material layer 401 (FIG. 6(c)).

(4) A second resin material is applied onto the reverse layer 501 to form a resin material layer 104, and then an imprint pattern of the mold is formed on the resin material layer 104 (FIG. 6(d)). At that time, a residual film 105 is generated.

The residual film 103 has a height (from the substrate surface to the recess of the first reverse layer of the first resin material) different from a height of the residual film 105 (a height from the substrate surface to a recess of the second resin material layer of the second resin material).

Further, the resin material layer 102 and the second resin material layer 104 are formed in an area 106 so as to overlap with each other as seen in a direction of a normal to the substrate surface.

Figure 6:
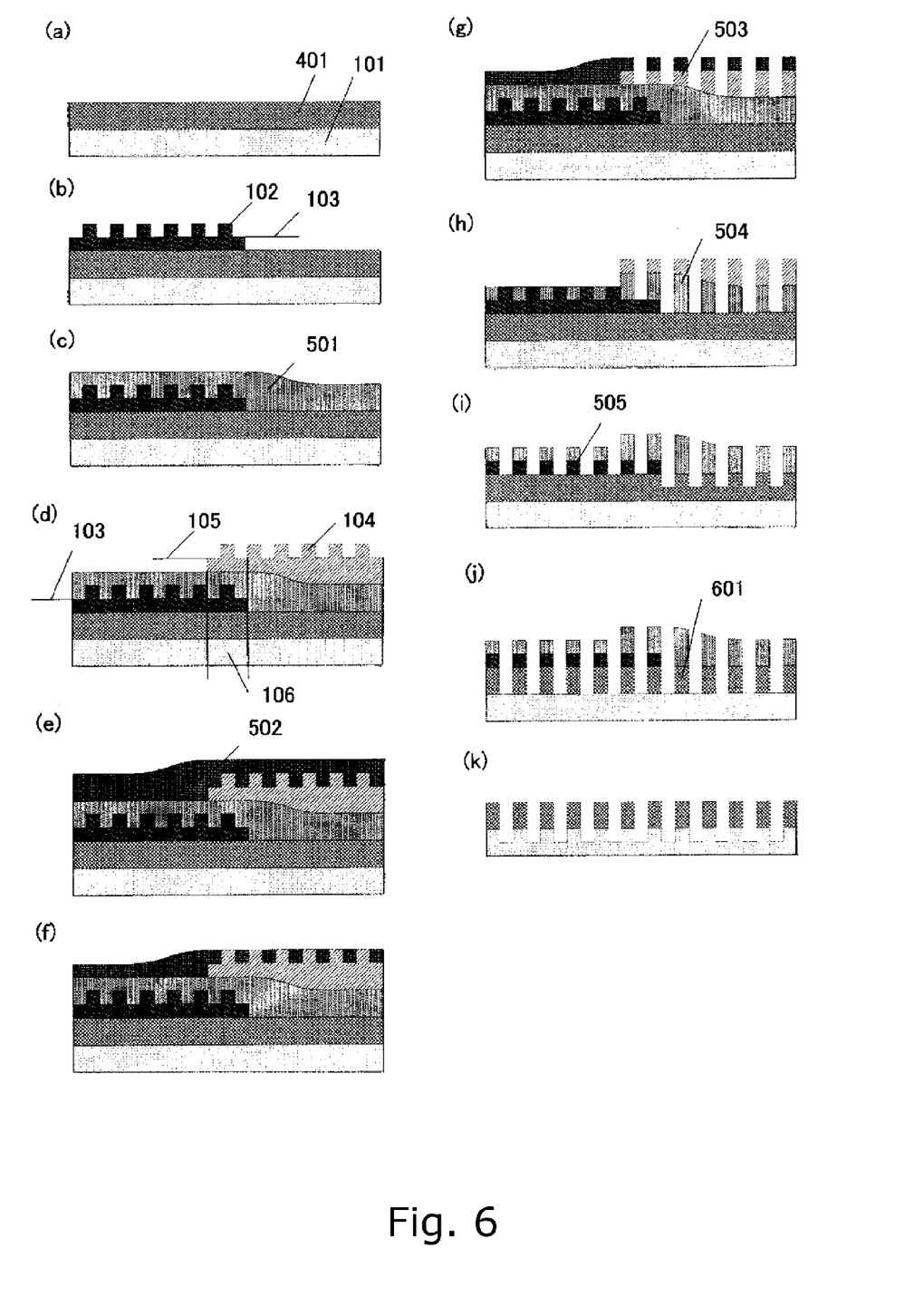

(5) A reverse layer 502 is formed on the resin material layer 104 and an exposed portion of the reverse layer 501 (FIG. 6(*e*)).

(6) The reverse layer 502 is removed until a projection of the resin material layer 104 is exposed (FIG. 6(*f*)). This removal processing can be selected from the group consisting of etching, CMP (chemical mechanical polishing), mechanical polishing, and the like.

(7) By using the reverse layer 502 as a mask, the resin material layer 104 is etched (FIG. 6(*g*)). As a result, a pattern 502 as a first reverse pattern is formed.

(8) The reverse layer 502 is removed, and thereafter, the reverse layer 501 is etched until a projection of the resin material layer 102 is exposed (FIG. 6(*h*)). At the same time, the reverse layer 501 under the resin material layer 104 is etched through the pattern 503 as a mask. As a result, a pattern 504 as a second reverse pattern is formed.

(9) The resin material layer 102 is etched through the reverse layer 501 as a mask (FIG. 6(*i*)). As a result, a pattern 505 as a third reverse pattern is formed.

(10) The fourth material layer 401 is etched through the patterns 504 and 505 as a mask (FIG. 6(*j*)). As a result, a pattern 601 as a fourth reverse pattern is formed.

(11) The substrate 101 is etched through the pattern 601 as a mask (FIG. 6(*k*)).

Selection of the material and the etching condition is made in accordance with Embodiment 3 for the resin material layers and the reverse layers and in accordance with Embodiment 2 for the fourth material layer.

Further, between the substrate surface and the surface at which the resin material layer of the first resin material is formed, it is possible to form a third material layer as a lower layer and the fourth material layer 401 as an upper layer. For example, as shown in FIG. 7(*a*), the fourth material layer is formed on the substrate 101, and a third material layer 402 can be formed thereon.

Figure 7:
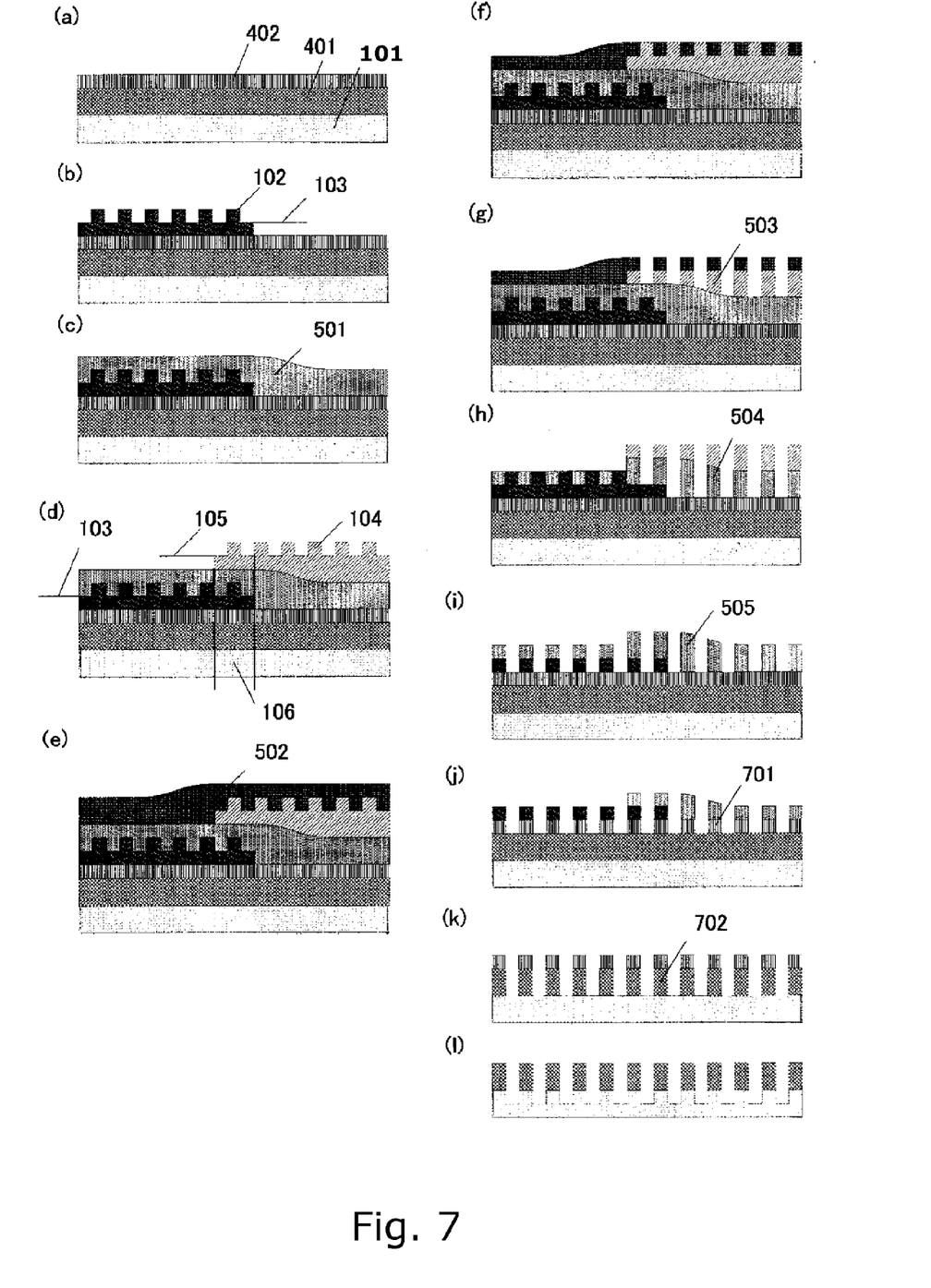

(1) A fourth material layer 401 is formed on a substrate 101 and thereon a third material layer 402 is formed (FIG. 7(*a*)).

(2) A first resin material is applied onto the third material layer 402 to form a resin material layer 102, and then an imprint (projection/recess) pattern of a mold is formed on the resin material layer 102 (FIG. 7(*b*)). At that time, a residual film 103 is generated.

(3) A reverse layer 501 is formed on the resin material layer 102 and an exposed portion of the third material layer 402 (FIG. 7(*c*)).

(4) A second resin material is applied onto the reverse layer 501 to form a resin material layer 104, and then an imprint pattern of the mold is formed on the resin material layer 104 (FIG. 7(*d*)). At that time, a residual film 105 is generated.

The residual film 103 has a height (from the substrate surface to the recess of the first reverse layer of the first resin material) different from a height of the residual film 105 (a height from the substrate surface to a recess of the second resin material layer of the second resin material).

Further, the resin material layer 102 and the second resin material layer 104 are formed in an area 106 so as to overlap with each other as seen in a direction of a normal to the substrate surface.

(5) A reverse layer 502 is formed on the resin material layer 104 and an exposed portion of the reverse layer 501 (FIG. 7(*e*)).

(6) The reverse layer 502 is removed until a projection of the resin material layer 104 is exposed (FIG. 7(*f*)). This removal processing can be selected from the group consisting of etching, CMP (chemical mechanical polishing), mechanical polishing, and the like.

(7) By using the reverse layer 502 as a mask, the resin material layer 104 is etched (FIG. 7(*g*)). As a result, a pattern 502 as a first reverse pattern is formed.

(8) The reverse layer 502 is removed, and thereafter, the reverse layer 501 is etched until a projection of the resin material layer 102 is exposed (FIG. 7(*h*)). At the same time, the reverse layer 501 under the resin material layer 104 is etched through the pattern 503 as a mask. As a result, a pattern 504 as a second reverse pattern is formed.

(9) The resin material layer 102 is etched through the reverse layer 501 as a mask (FIG. 7(*i*)). As a result, a pattern 505 as a third reverse pattern is formed.

(10) The third material layer 402 is etched through the patterns 504 and 505 as a mask (FIG. 7(*j*)). As a result, a pattern 701 as a fifth reverse pattern is formed.

(11) The fourth material layer 401 is etched through the third material layer 402 as a mask (FIG. 7(*k*)). As a result, a pattern 702 as a sixth reverse pattern is formed.

(12) The substrate 101 is etched through the pattern 702 as a mask (FIG. 7(*l*)).

Selection of the material and the etching conditions is made in accordance with Embodiment 3 for the resin material layers and the reverse layers and in accordance with Embodiment 2 for the fourth material layer.

In the constitution shown in FIGS. 6(*a*) to 6(*k*), a height of the mask pattern is not constant, so that etching characteristics can vary by a micro-loading effect. The micro-loading effect is a phenomenon in which a variation in the etching rate or side wall shape occurs depending on a pattern width or an aspect ratio of the pattern.

In the constitution shown in FIGS. 7(*a*) to 7(*l*), such a phenomenon can be alleviated or overcome. This is because, in the step shown in FIG. 7(*i*), by sufficiently increasing an amount of etching of the third material layer 402, it is possible to reduce the thickness of the reverse layer 503 or remove the reverse layer 503. As a result, as shown in FIG. 7(*k*), it is possible to realize a substantially constant height of the mask pattern 702.

In the present invention, by using the above-described structure preparation methods, it is possible to connect adjacent patterns in shot areas with no gap.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 018635/2008, filed Jan. 30, 2008, which is hereby incorporated herein by reference.

What is claimed is:

1. A manufacturing method of a structure by imprint, comprising:

a first imprint step of forming a first resin material layer by applying a first resin material onto a substrate and then transferring an imprint pattern of a mold onto the first resin material layer;

a second imprint step of forming a second resin material layer by applying a second resin material onto the first resin material layer formed in said first imprint step and onto an area of the substrate adjacent to the first resin material layer and then transferring the imprint pattern of the mold onto the second resin material layer; and a step of forming a pattern by etching the first and second resin material layers, wherein in said second imprint step, the imprint pattern of the mold is transferred onto the second resin material layer so that a part of a projection of the imprint pattern transferred onto the first resin material layer and a part of a projection of the imprint pattern transferred onto the second resin material layer overlap with each other.

2. A method according to claim 1, wherein said manufacturing method further comprises a step of etching the substrate through the pattern formed by etching the first and second resin material layers as a mask.

3. A method according to claim 1, wherein said manufacturing method further comprises a first etching step of etching the second resin material, different from the first resin material, under a condition that an etching speed of the second resin material is higher than an etching speed of the first resin material when the pattern is formed by etching the first and second resin material layers.

4. A method according to claim 3, wherein said manufacturing method further comprises a second etching step of etching the first and second resin materials under a condition that a selection ratio is lower than the selection ratio in said first etching step when the pattern is formed by etching the first and second resin material layers.

5. A method according to claim 4, wherein said second etching step is performed after the second resin material layer is etched in a predetermined thickness in said first etching step.

6. A method according to claim 4, wherein said first etching step is performed after the first resin material layer is etched in a predetermined thickness in said second etching step.

7. A method according to claim 3, wherein in said first etching step, the first and second resin material layers are etched until a recess of the pattern formed on the first resin material layer and a recess of the pattern formed on the second resin material layer have the same height.

8. A method according to claim 1, wherein the first resin material is a silicon containing resin material or a silicon oxide compound and the second resin material is a non silicon based material.

9. A method according to claim 3, wherein the selection ratio in said first etching step is 5 or more.

10. A method according to claim 1, wherein said manufacturing method further comprises:

a step of forming a third material layer as an upper layer and a fourth material layer as a lower layer between a surface of the substrate and a surface at which the first resin material layer is to be formed;

a step of forming a first pattern by etching the third material layer through, as a mask, the pattern formed by etching the first and second resin material layers; and a step of forming a second pattern by etching the fourth material layer through the first pattern as a mask.

11. A method according to claim 10, wherein said manufacturing method further comprises a step of processing the substrate by etching through the second pattern as a mask.

12. A method according to claim 1, wherein said manufacturing method further comprises:

a step of forming a first reverse layer on the first resin material layer, onto which the pattern of the mold is transferred, in said first imprint step; and a step of forming a second reverse layer on the second resin material layer, onto which the pattern of the mold is transferred, in said second imprint step.

13. A method according to claim 12, wherein said manufacturing method further comprises:

a step of removing the second reverse layer until a projection of the second resin material layer is exposed;

a step of forming a first reverse pattern by etching the second resin material layer through the second reverse layer as a mask;

a step of forming a second reverse pattern by etching the first reverse layer through the first reverse pattern as a mask;

a step of forming a third reverse pattern by etching the first resin material layer through the second reverse pattern as a mask; and a step of processing the substrate by etching through the third reverse pattern as a mask.

14. A method according to claim 13, wherein said step of forming the third reverse pattern includes a step of removing the second reverse layer and the first reverse layer until a projection of the first resin material layer is exposed.

15. A method according to claim 13, wherein in said step of forming the first reverse pattern and said step of forming the third reverse pattern the second resin material layer and the second reverse layer or the first resin material layer and the first reverse layer provide a selection ratio of 5 or more.

16. A method according to claim 12, wherein said manufacturing method further comprises:

a step of removing the second reverse layer until a projection of the second resin material layer is exposed;

a step of forming a first reverse pattern by etching the second resin material layer through the second reverse layer as a mask;

a step of forming a second reverse pattern by etching the first reverse layer through the first reverse pattern as a mask;

a step of forming a third reverse pattern by etching the first resin material layer through the second reverse pattern as a mask;

a step of forming a fourth material layer between a surface of the substrate and a surface at which the first resin material layer is to be formed;

a step of forming a fourth reverse pattern by etching the fourth material layer through the third reverse pattern as a mask; and a step of processing the substrate by etching through the fourth reverse pattern as a mask.

17. A method according to claim 12, wherein said manufacturing method further comprises:

a step of removing the second reverse layer until a projection of the second resin material layer is exposed;

a step of forming a first reverse pattern by etching the second resin material layer through the second reverse layer as a mask;

a step of forming a second reverse pattern by etching the first reverse layer through the first reverse pattern as a mask;

a step of forming a third reverse pattern by etching the first resin material layer through the second reverse pattern as a mask;

a step of forming a third material layer as an upper layer and a fourth material layer as a lower layer between a surface of the substrate and a surface at which the first resin material layer is to be formed;

a step of forming a fifth reverse pattern by etching the third material layer through the third reverse pattern as a mask;

a step of forming a sixth reverse pattern by etching the fourth material layer through the fifth reverse pattern as a mask; and a step of processing the substrate by etching through the sixth reverse pattern as a mask.

18. A method according to claim 10 or 17, wherein the third material layer is formed of a material selected from the group consisting of silicon dioxide, silicon nitride, a silicon containing resin material, a silicon oxide compound, and a metal material.

19. A method according to any one of claims 10, 16 and 17, wherein the fourth material layer is formed of a hydrocarbon compound or a carbon compound.

20. A method according to claim 12, wherein the first reverse layer and the second reverse layer are formed of a material selected from the group consisting of silicon dioxide, silicon nitride, a silicon containing resin material, a silicon oxide compound, and a metal material.

* * * * *